(12) United States Patent
Lai et al.

(10) Patent No.: US 12,225,273 B2
(45) Date of Patent: Feb. 11, 2025

(54) IMAGE SENSOR AND CONTROL METHOD THEREOF

(71) Applicant: VisEra Technologies Company Ltd., Hsin-Chu (TW)

(72) Inventors: Lai-Hung Lai, Hsin-Chu (TW); Wen-Yu Shih, Hsin-Chu (TW); Chin-Chuan Hsieh, Hsin-Chu (TW)

(73) Assignee: VisEra Technologies Company Ltd., Hsin-Chu (TW)

( * ) Notice: Subject to any disclaimer, the term of this patent is extended or adjusted under 35 U.S.C. 154(b) by 64 days.

(21) Appl. No.: 18/323,915

(22) Filed: May 25, 2023

(65) Prior Publication Data

US 2024/0040213 A1 Feb. 1, 2024

Related U.S. Application Data

(60) Provisional application No. 63/392,456, filed on Jul. 26, 2022.

(51) Int. Cl.
*H04N 23/11* (2023.01)
*H04N 23/12* (2023.01)
*H04N 23/667* (2023.01)
*H04N 25/13* (2023.01)
*H04N 25/79* (2023.01)
*H10K 39/32* (2023.01)

(52) U.S. Cl.
CPC ............ *H04N 23/11* (2023.01); *H04N 23/12* (2023.01); *H04N 23/667* (2023.01); *H04N 25/135* (2023.01); *H04N 25/79* (2023.01); *H10K 39/32* (2023.02)

(58) Field of Classification Search
CPC ...... H04N 23/11; H04N 23/12; H04N 23/667; H04N 25/135; H04N 25/79; H10K 39/32; H01L 27/14621; H01L 27/14627; H01L 27/14667; H01L 27/1462
USPC ........................................................ 348/164
See application file for complete search history.

(56) References Cited

U.S. PATENT DOCUMENTS

| 2009/0223566 | A1* | 9/2009 | Mitsui | B82Y 10/00 |
| | | | | 136/263 |
| 2019/0129036 | A1* | 5/2019 | Valouch | H10K 30/35 |
| 2021/0118920 | A1* | 4/2021 | Kim | H10K 85/50 |
| 2021/0305320 | A1* | 9/2021 | Lim | H10K 85/654 |

FOREIGN PATENT DOCUMENTS

| EP | 4102567 A | 12/2022 | |
| JP | 7066036 B | 5/2022 | |
| JP | 7066036 B1 * | 5/2022 | ............... G02B 5/22 |
| WO | WO-2020105360 A1 * | 5/2020 | ............. G02B 5/208 |

* cited by examiner

*Primary Examiner* — Marnie A Matt
(74) *Attorney, Agent, or Firm* — LIU & LIU

(57) ABSTRACT

The present disclosure provides an image sensor and control method thereof. The image sensor includes a first transparent conductive layer, a second conductive layer, an optical sensor and a semiconductor substrate. The optical sensor is arranged between the first transparent conductive layer and the second conductive layer, and includes a photoelectric conversion layer, wherein the photoelectric conversion layer has a thickness ranging from 500 to 10000 nm, and the optical sensor has a plurality of absorption spectrum ranges. The semiconductor substrate is below the second conductive layer.

20 Claims, 16 Drawing Sheets

IMAGE SENSOR AND CONTROL METHOD THEREOF

CROSS-REFERENCE TO RELATED APPLICATION

This application claims priority to U.S. Provisional Application Ser. No. 63/392,456, filed on Jul. 26, 2022, which is herein incorporated by reference.

BACKGROUND

Field of Invention

This disclosure relates to an image sensor and control method thereof, and in particular to an image sensor capable of switching among multiple operation modes and control method thereof.

Description of Related Art

Many devices today often detect the light in the near-infrared/short-wave infrared wavelength range to meet the requirements for different applications, such as face sensing, motion detection, machine vision, augmented reality (AR), virtual reality (VR), etc. However, for detecting the light in the near-infrared/short-wave infrared wavelength range, those devices are usually fabricated at high cost and complexity.

SUMMARY

An aspect of present disclosure relates to an image sensor. The image sensor includes a first transparent conductive layer, a second conductive layer, an optical sensor and a semiconductor substrate. The optical sensor is arranged between the first transparent conductive layer and the second conductive layer, and includes a photoelectric conversion layer, wherein the photoelectric conversion layer has a thickness ranging from 500 to 10000 nm, and the optical sensor has a plurality of absorption spectrum ranges. The semiconductor substrate is below the second conductive layer.

Another aspect of present disclosure relates to a control method of image sensor. The image sensor includes an optical sensor, and the control method includes: determining to operate the image sensor in one of a plurality of operation modes; adjusting a bias voltage applied to the optical sensor to a first voltage level when the image sensor is determined to operate in a narrowband mode of the plurality of operation modes, so that the optical sensor has a first absorption spectrum range; and adjusting the bias voltage to a second voltage level different from the first voltage level when the image sensor is determined to operate in a broadband mode or a wideband mode of the plurality of operation modes, so that the optical sensor has a second absorption spectrum range or a third absorption spectrum range, wherein the second absorption spectrum range and the third absorption spectrum range both are wider than the first absorption spectrum range.

It is to be understood that both the foregoing general description and the following detailed description are by examples, and are intended to provide further explanation of the invention as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiments are described in detail below with reference to the appended drawings to better understand the aspects of the present application. However, the provided embodiments are not intended to limit the scope of the disclosure, and the description of the structural operation is not intended to limit the order in which they are performed. Any device that has been recombined by components and produces an equivalent function is within the scope covered by the disclosure.

As used herein, "coupled" and "connected" may be used to indicate that two or more elements physical or electrical contact with each other directly or indirectly, and may also be used to indicate that two or more elements cooperate or interact with each other.

Figure 1:
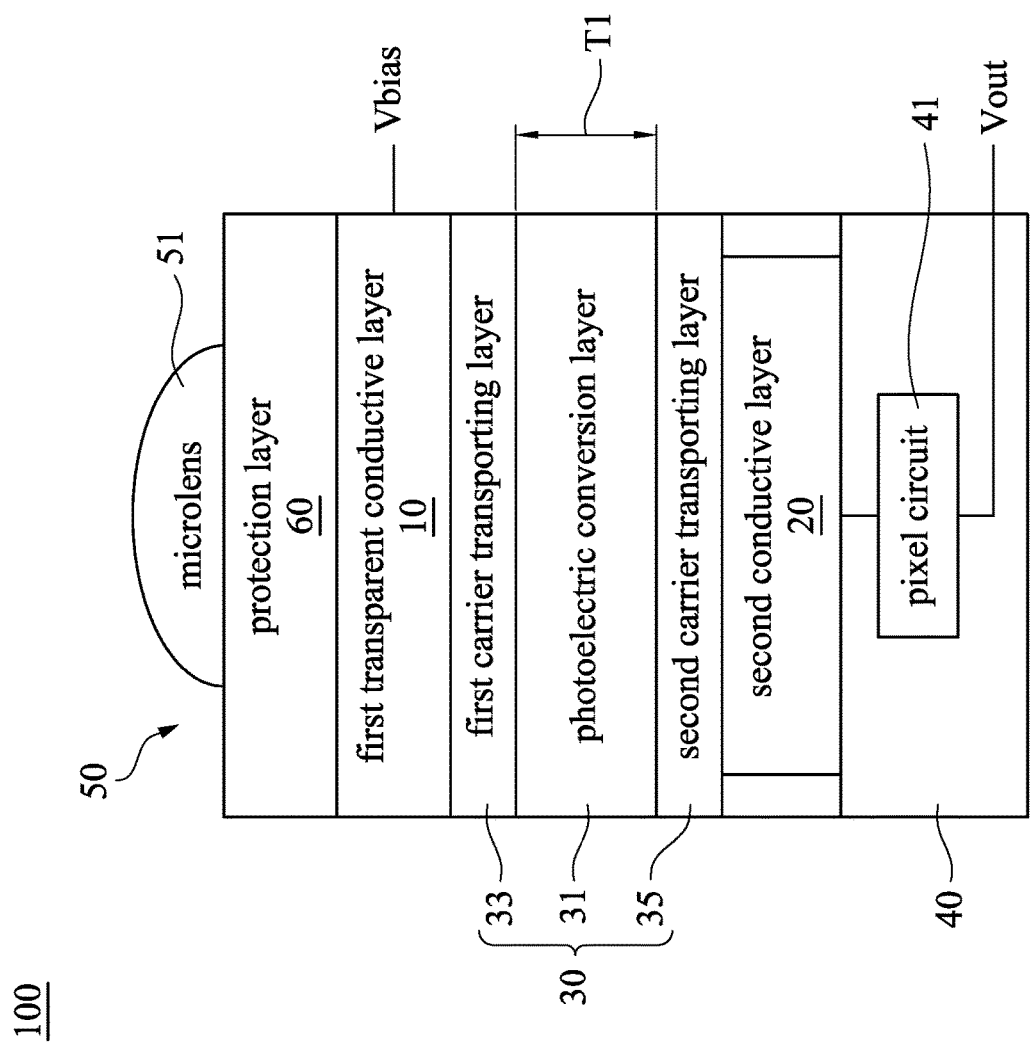
FIG. 1 is a sectional diagram of an image sensor in accordance with some embodiments of the present disclosure.

Referring to FIG. 1, FIG. 1 is a sectional diagram of an image sensor 100 in accordance with some embodiments of the present disclosure. In some embodiments, the image sensor 100 is applied to some electronic imaging devices (e.g., camera, etc.), and is configured to sense light and convert the light into signals for forming images. In particular, the image sensor 100 can be a complementary metal oxide semiconductor (CMOS) sensor, etc. However, the present disclosure is not limited herein.

In some embodiments, as shown in FIG. 1, the image sensor 100 includes a first transparent conductive layer 10, a second conductive layer 20, an optical sensor 30, a semiconductor substrate 40, a microlens layer 50 and a protection layer 60. The optical sensor 30 is arranged between the first transparent conductive layer 10 and the second conductive layer 20. The microlens layer 50 is over the first transparent conductive layer 10, in which the microlens layer 50 includes at least one microlens 51. The protection layer 60 is arranged between the microlens layer 50 and the first transparent conductive layer 10, in which the protection layer 60 includes an oxide material (e.g., silicon oxide, aluminum oxide, etc.), a nitride material (e.g., silicon nitride, etc.), an oxynitride material (e.g., silicon oxynitride, etc.), a hydrogenated silicon (Si:H) or a combination thereof. The semiconductor substrate 40 is below the second conductive layer 20, in which the semiconductor substrate 40 includes at least one pixel circuit 41.

In some embodiments, as shown in FIG. 1, the optical sensor 30 includes a photoelectric conversion layer 31, a first carrier transporting layer 33 and a second carrier transporting layer 35. The first carrier transporting layer 33 is arranged between the first transparent conductive layer 10 and the photoelectric conversion layer 31, and the second carrier transporting layer 35 is arranged between the photoelectric conversion layer 31 and the second conductive layer 20. In other words, the photoelectric conversion layer 31 is arranged between the first carrier transporting layer 33 and the second carrier transporting layer 35. Furthermore, the first carrier transporting layer 33 and the second carrier transporting layer 35 are configured to be the hole transporting layer (HTL) and the electron transporting layer (ETL), respectively. That is, the first carrier transporting layer 33 is used to transport holes, and the second carrier transporting layer 35 is used to transport electrons.

In accordance with the above embodiments, the material of the first carrier transporting layer 33 includes inorganic materials, such as molybdenum trioxide ($MoO_3$), Nickel(II) oxide (NiO), and tungsten trioxide ($WO_3$), and/or organic materials, such as poly(3,4-ethylenedioxythiophene): polystyrene sulfonate (PEDOT:PSS). The first carrier transporting layer 33 has a thickness ranging from 1 to 200 nm. The material of the second carrier transporting layer 35 includes inorganic materials, such as zinc oxide (ZnO), and titanium dioxide ($TiO_2$), and/or organic materials, such as buckyball (C60), [6,6]-phenyl-$C_{61}$-butyric acid methyl ester (PCBM), and fullerene derivatives. The second carrier transporting layer 35 has a thickness ranging from 1 to 200 nm. The photoelectric conversion layer 31 includes organic materials, quantum dot (QD) materials, perovskite materials or a combination thereof.

In some embodiments, the photoelectric conversion layer 31 is formed by using coating technology, such as blade coating, slot-die coating, etc. By controlling the coating parameters, such as coating speed, coating temperature, viscosity of the ink, gap between coating tip and substrate, and the number of times of the coating, the photoelectric conversion layer 31 being formed has a thickness T1 ranging from 500 to 10000 nm. Notably, the image sensor 100 of the present disclosure can be switched among multiple operation modes through the photoelectric conversion layer 31 with the thickness T1. Some related arts use spin coating to form the photoelectric conversion layer. However, the photoelectric conversion layer formed by using spin coating cannot have such thickness like the photoelectric conversion layer 31 of the present disclosure has. Thus, the image sensor applying the photoelectric conversion layer formed by using spin coating cannot be switched among multiple operation modes.

Figure 2:
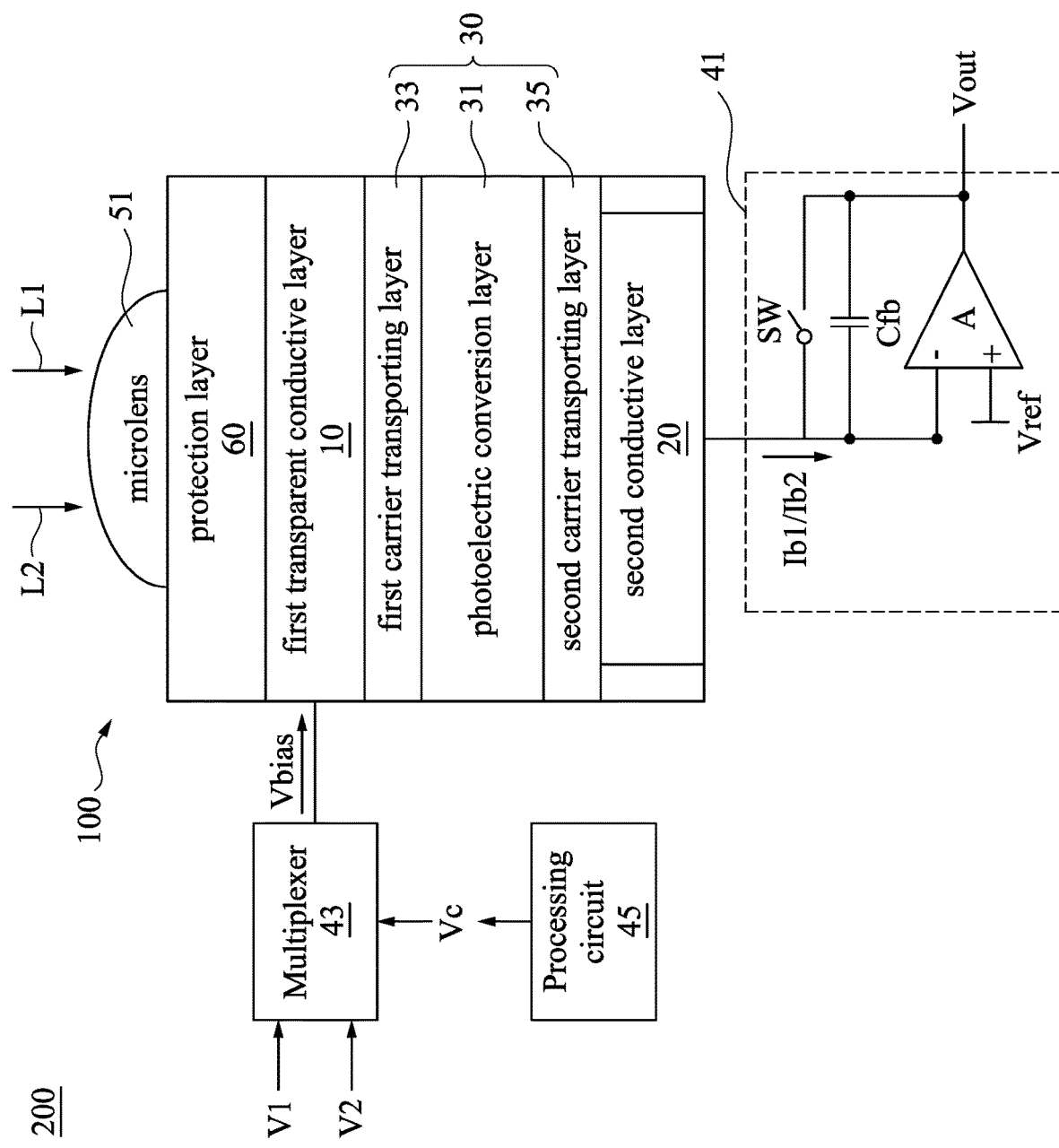
FIG. 2 is a schematic diagram of an electronic imaging device including the image sensor of FIG. 1 in accordance with some embodiments of the present disclosure.

Referring to FIG. 2, FIG. 2 is a schematic diagram of an electronic imaging device 200 including the image sensor 100, a multiplexer 43 and a processing circuit 45 in accordance with some embodiments of the present disclosure. In some embodiments, as shown in FIG. 2, the pixel circuit 41 is implemented by a capacitive trans-impedance amplifier (CTIA), but the present disclosure is not limited herein. In the embodiments that the pixel circuit 41 is implemented by the CTIA, the pixel circuit 41 includes an amplifier A, a reset switch SW, and an integrating capacitor Cfb. The reset switch SW and the integrating capacitor Cfb are connected in parallel, and are then connected between a negative input terminal and an output terminal of the amplifier A. The inverted input terminal of the amplifier A is further connected to the second conductive layer 20. In addition, a non-inverted input terminal of the amplifier A is configured to receive a reference voltage Vref.

In some embodiments, the multiplexer 43 is configured to apply a bias voltage Vbias to the image sensor 100. As shown in FIG. 2, the multiplexer 43 is electrically coupled to the first transparent conductive layer 10. The multiplexer 43 is configured to receive a control signal Vc outputted by the processing circuit 45, a first voltage input with voltage level V1 and a second voltage input with voltage level V2, and is configured to choose one of the first and second voltage inputs as the bias voltage Vbias according to the control signal Vc. The bias voltage Vbias is then applied to the first transparent conductive layer 10. The optical sensor 30 is configured to receive the bias voltage Vbias via the first transparent conductive layer 10. Notably, the optical characteristic of the optical sensor 30 would changes with the voltage level of the bias voltage Vbias, which further results in different operation modes of the image sensor 100. In the embodiments of FIG. 2, the first voltage level V1 is different from the second voltage level V2. For example, the magnitude of the first voltage level V1 (e.g., 0 V to −10 V, etc.) is smaller than the magnitude of the second voltage level V2 (e.g., −10 V to −18 V, etc.). As a result, the image sensor 100 may be switched between two operation modes according to the voltage level of the bias voltage Vbias. For illustrative purpose, only the first voltage input with the first voltage level V1 and the second voltage input with second voltage level V2 are shown in FIG. 2, but the present disclosure is not limited herein. In some embodiments, the multiplexer 43 receives more than two voltage inputs with different voltage levels, and the control signal Vc controls the multiplexer 43 to output one of the voltage inputs as the bias voltage Vbias, so that the bias voltage Vbias is controlled by the control signal Vc to have one of the different voltage levels. As such, the image sensor 100 may be operated in one of multiple operation modes respectively corresponding to the different voltage levels of the bias voltage Vbias.

Figure 3:
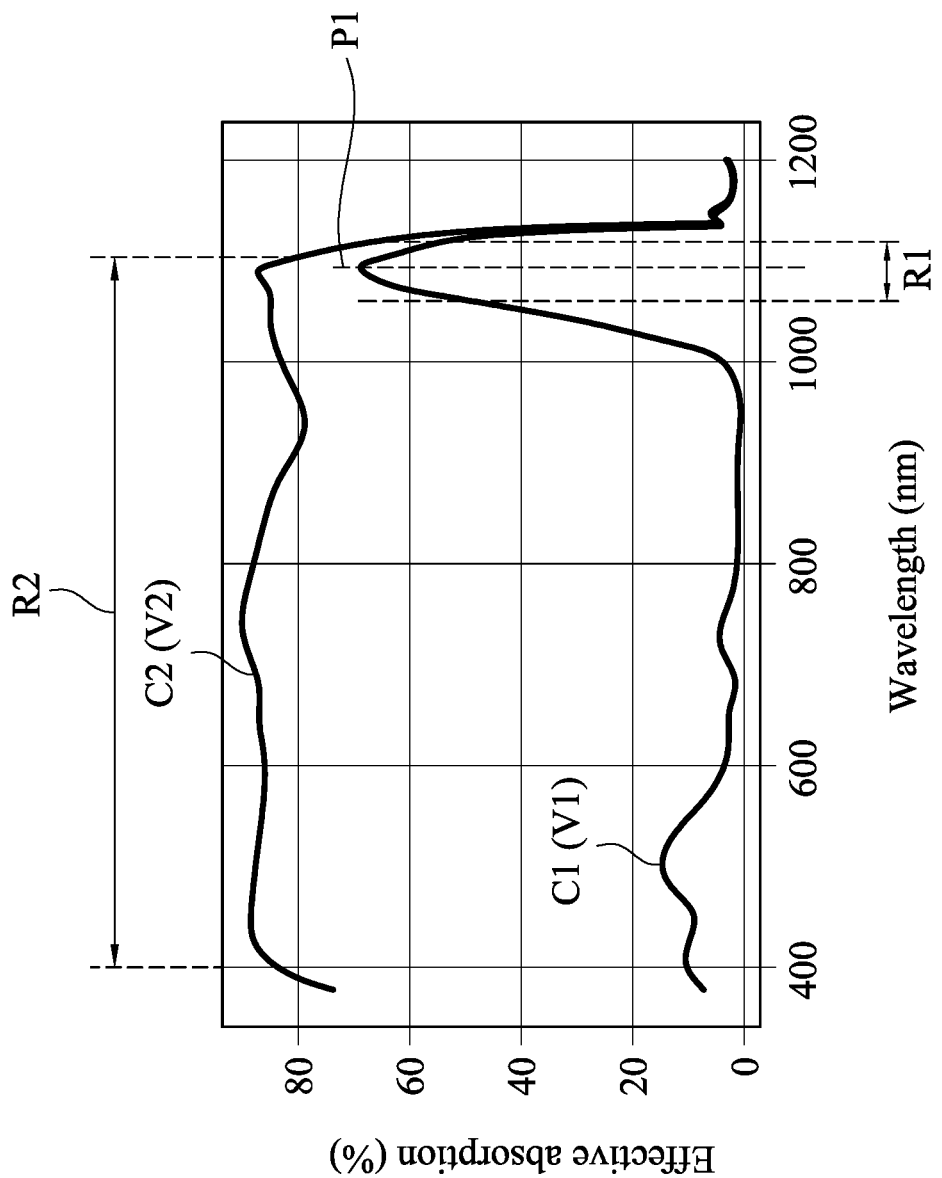
FIG. 3 is a schematic diagram of multiple optical characteristics of the optical sensor in FIG. 1 corresponding to the different voltage levels of the bias voltage in accordance with some embodiments of the present disclosure.

Referring to FIG. 3, FIG. 3 is a schematic diagram of multiple optical characteristics of the optical sensor 30 corresponding to the different voltage levels of the bias voltage Vbias in accordance with some embodiments of the present disclosure. In FIG. 3, a curve C1 represents one optical characteristic of the optical sensor 30 in the condition that the bias voltage Vbias has the first voltage level V1, and a curve C2 represents another optical characteristic of the optical sensor 30 in the condition that the bias voltage Vbias has the second voltage level V2.

In the condition that the bias voltage Vbias has the first voltage level V1, the light having the wavelength shorter than 1000 nm penetrates into the photoelectric conversion layer 31 to a shallower depth, but the light having the wavelength exceeding 1000 nm penetrates into the photoelectric conversion layer 31 to a deeper depth. Therefore, the optical sensor 30 is easy to collect the photogenerated carriers (e.g., electrons, holes, etc.) of the light having the wavelength exceeding 1000 nm, but is much difficult to collect the photogenerated carriers of the light having the wavelength shorter than 1000 nm. As a result, as shown in FIG. 3, the optical sensor 30 is controlled in an absorption spectrum range R1 according to the bias voltage Vbias having the first voltage level V1. In the embodiments of FIG. 3, the absorption spectrum range R1 may have a peak wavelength P1, the peak wavelength P1 of the absorption spectrum range R1 is substantially 1100 nm, but the present disclosure is not limited herein. For example, in some embodiments, the peak wavelength P1 of the absorption spectrum range R1 is substantially 940, 1310, 1350, 1400, 1450, or 1550 nm.

In the condition that the bias voltage Vbias has the second voltage level V2 greater than the first voltage level V1 in magnitude, the optical sensor 30 becomes easier to collect the photogenerated carriers of the light having the wavelength shorter than 1000 nm with the help of a strong electric field generated by the bias voltage Vbias having the second voltage level V2. As a result, as shown in FIG. 3, the optical sensor 30 is controlled in an absorption spectrum range R2 wider than the absorption spectrum range R1 according to the bias voltage Vbias having the second voltage level V2. In the embodiments of FIG. 3, the absorption spectrum range R2 is substantially between 400-1100 nm, however, the present disclosure is not limited herein. For example, in some embodiments, the absorption spectrum range R2 is substantially between 400-940 nm, 400-1310 nm, 400-1350 nm, 400-1400 nm, 400-1450 nm or 400-1550 nm.

In accordance with the embodiments of FIG. 3, the image sensor 100 is operated in a narrowband mode of the operation modes when the optical sensor has the absorption spectrum range R1 according to the first voltage level V1, and is operated in a broadband mode of the operation modes when the optical sensor 30 has the absorption spectrum range R2 wider than the absorption spectrum range R1 according to the second voltage level V2.

Referring to FIG. 2 again, in the narrowband mode, the photoelectric conversion layer 31 of the optical sensor 30 is configured to absorb a first light L1 with a first wavelength range, and is configured to generates a first current signal Ib1 corresponding to the first light L1 to the pixel circuit 41. The first wavelength range is substantially corresponding to (e.g., within or mostly overlapping) the absorption spectrum range R1 as shown in FIG. 3. In the broadband mode, the photoelectric conversion layer 31 of the optical sensor 30 is configured to absorb a second light L2 with a second wavelength range, and is configured to generates a second current signal Ib2 corresponding to the second light L2 to the pixel circuit 41. The second wavelength range is substantially corresponding to (e.g., within or mostly overlapping) the absorption spectrum range R2 as shown in FIG. 3.

As can be seen from above that, the first light L1 is near-infrared (NIR) light, shortwave infrared (SWIR) light, or a combination thereof. Also, the second light L2 is ultraviolet (UV) light, visible light, NIR light, SWIR light, or a combination thereof.

The operation of the pixel circuit 41 would be described herein with reference to FIG. 2 again. First, the reset switch SW is closed to reset the amplifier A. When the reset switch SW is closed, the integrating capacitor Cfb is discharged, so that the output terminal of the amplifier A is reset to the reference voltage Vref. Afterward, the reset switch SW is opened. When the reset switch SW is opened and the photoelectric conversion layer 31 of the optical sensor 30 absorbs the first light L1 or the second light L2, the photoelectric conversion layer 31 generates the first current signal Ib1 or the second current signal Ib2 to the pixel circuit 41. Accordingly, the integrating capacitor Cfb is charged, and electric charges corresponding to the first current signal Ib1 or the second current signal Ib2 are accumulated in the integrating capacitor Cfb. As a result, an output signal Vout corresponding to the accumulated electric charges is generated at the output terminal of the amplifier A. It can be seen from above that the pixel circuit 41 is configured to output the output signal Vout according to the first current signal Ib1 or the second current signal Ib2 generated by the optical sensor 30.

Figure 4:
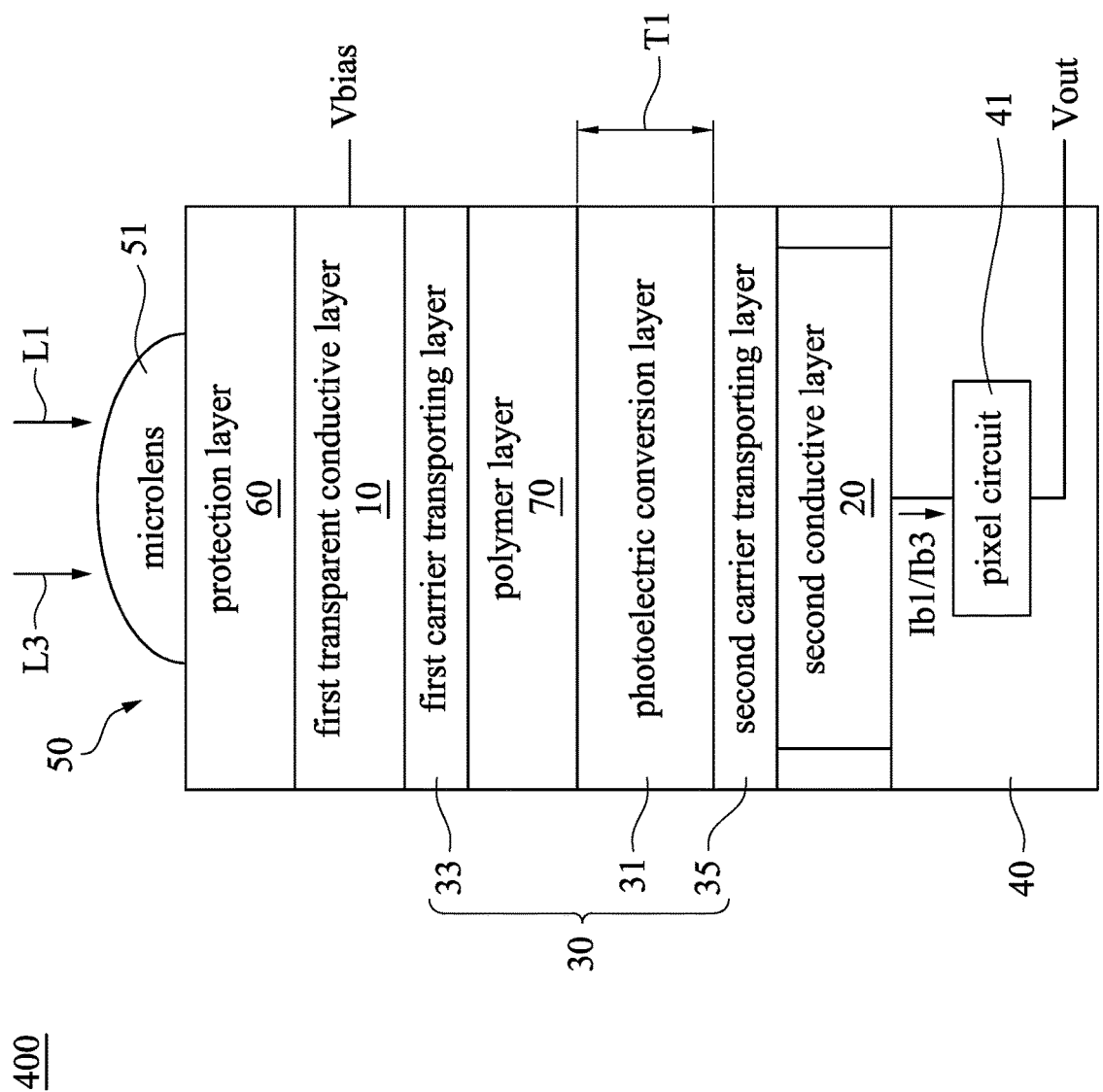
FIG. 4 is a sectional diagram of an image sensor in accordance with some embodiments of the present disclosure.

The structure of the image sensor of the present disclosure is not limited to the image sensor 100 of FIG. 1, which would be described below with reference to FIGS. 4 and 6. Referring to FIG. 4, FIG. 4 is a sectional diagram of an image sensor 400 in accordance with some embodiments of the present disclosure. In some embodiments, besides the first transparent conductive layer 10, the second conductive layer 20, the optical sensor 30, the semiconductor substrate 40, the microlens layer 50 and the protection layer 60 as shown in FIG. 1, the image sensor 400 further includes a polymer layer 70. As shown in FIG. 4, the polymer layer 70 is arranged below the first transparent conductive layer 10, and is between the first carrier transporting layer 33 and the photoelectric conversion layer 31.

Figure 5:
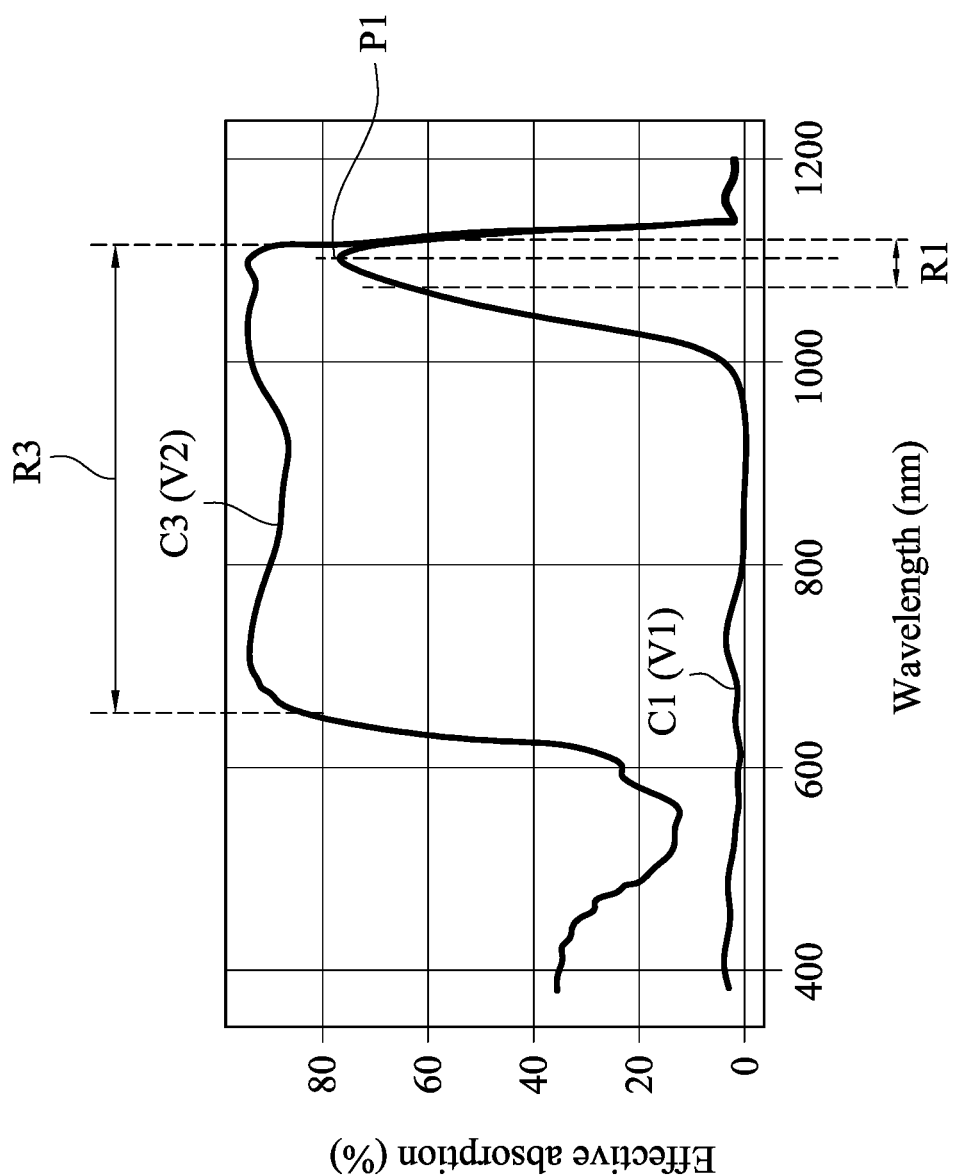
FIG. 5 is a schematic diagram of multiple optical characteristics of the optical sensor in FIG. 4 corresponding to the different voltage levels of the bias voltage in accordance with some embodiments of the present disclosure.

In some embodiments, the additional polymer layer 70 is configured to filter out the visible light with the wavelength range between 400-650 nm, which results in the optical sensor 30 of the image sensor 400 having optical characteristics different from those of the optical sensor 30 of the image sensor 100. Referring to FIG. 5, FIG. 5 is a schematic diagram of the optical characteristics of the optical sensor 30 of the image sensor 400 in accordance with some embodiments of the present disclosure. In FIG. 5, a curve C3 represents one optical characteristic of the optical sensor 30 of the image sensor 400 in the condition that the bias voltage Vbias has the second voltage level V2. The elements in FIG. 5 denoted by the same reference characters as those in FIG. 3 will not be repeatedly described herein.

In the condition that the bias voltage Vbias having the second voltage level V2 is applied to the image sensor 400, the optical sensor 30 of the image sensor 400 is controlled in an absorption spectrum range R3. As shown in FIG. 5, the absorption spectrum range R3 is wider than the absorption spectrum range R1, but is narrower than the absorption spectrum range R2 (as shown in FIG. 3) because the visible light with the wavelength range between 400-650 nm is filtered out by the polymer layer 70. In the embodiments of FIG. 5, the absorption spectrum range R3 is substantially between 650-1100 nm, however, the present disclosure is not limited herein. For example, in some embodiments, the absorption spectrum range R3 is substantially between 650-940 nm, 650-1310 nm, 650-1350 nm, 650-1400 nm, 650-1450 nm or 650-1550 nm.

In addition, the image sensor 400 is operated in a wideband mode of the operation modes when the optical sensor 30 has the absorption spectrum range R3 according to the second voltage level V2. Referring to FIG. 4 again, in the wideband mode, the photoelectric conversion layer 31 of the optical sensor 30 is configured to absorb a third light L3 with a third wavelength range, and is configured to generates a third current signal Ib3 corresponding to the third light L3 to the pixel circuit 41. Then, the pixel circuit 41 generates the output voltage Vout according to the third current signal Ib3. The third wavelength range of the third light L3 is substantially corresponding to (e.g., within or mostly overlapping) the absorption spectrum range R3 as shown in FIG. 5. As can be seen from above that, the third light L3 is visible light (having the wavelength longer than 650 nm), NIR light, SWIR light, or a combination thereof.

Figure 6:
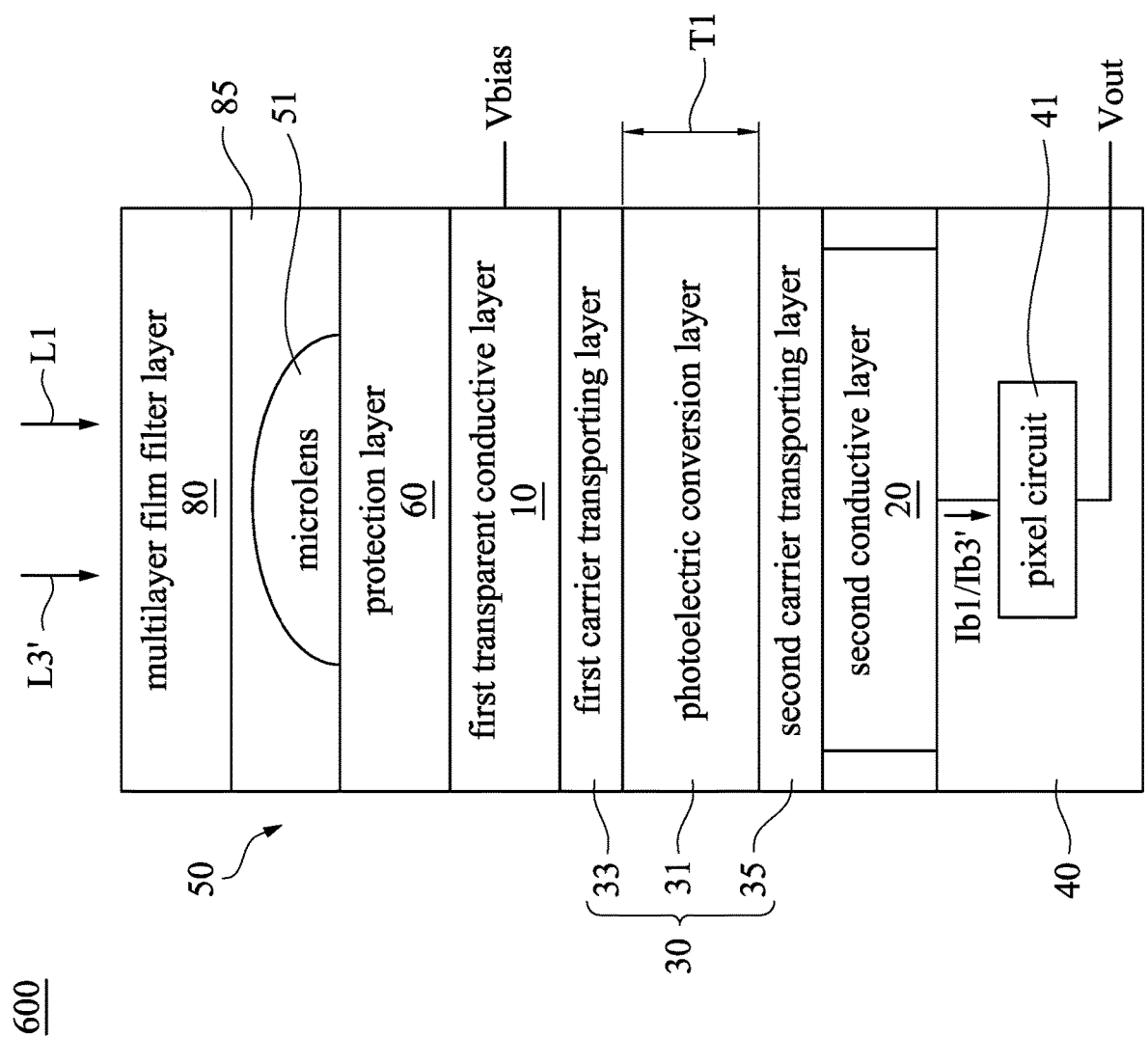
FIG. 6 is a sectional diagram of an image sensor in accordance with some embodiments of the present disclosure.

Referring to FIG. 6, FIG. 6 is a sectional diagram of an image sensor 600 in accordance with some embodiments of the present disclosure. In some embodiments, besides the first transparent conductive layer 10, the second conductive layer 20, the optical sensor 30, the semiconductor substrate 40, the microlens layer 50 and the protection layer 60 as shown in FIG. 1, the image sensor 600 further includes a multilayer film filter layer 80. As shown in FIG. 6, the multilayer film filter layer 80 is arranged over the microlens layer 50 via a low refractive index material 85.

Figure 7:
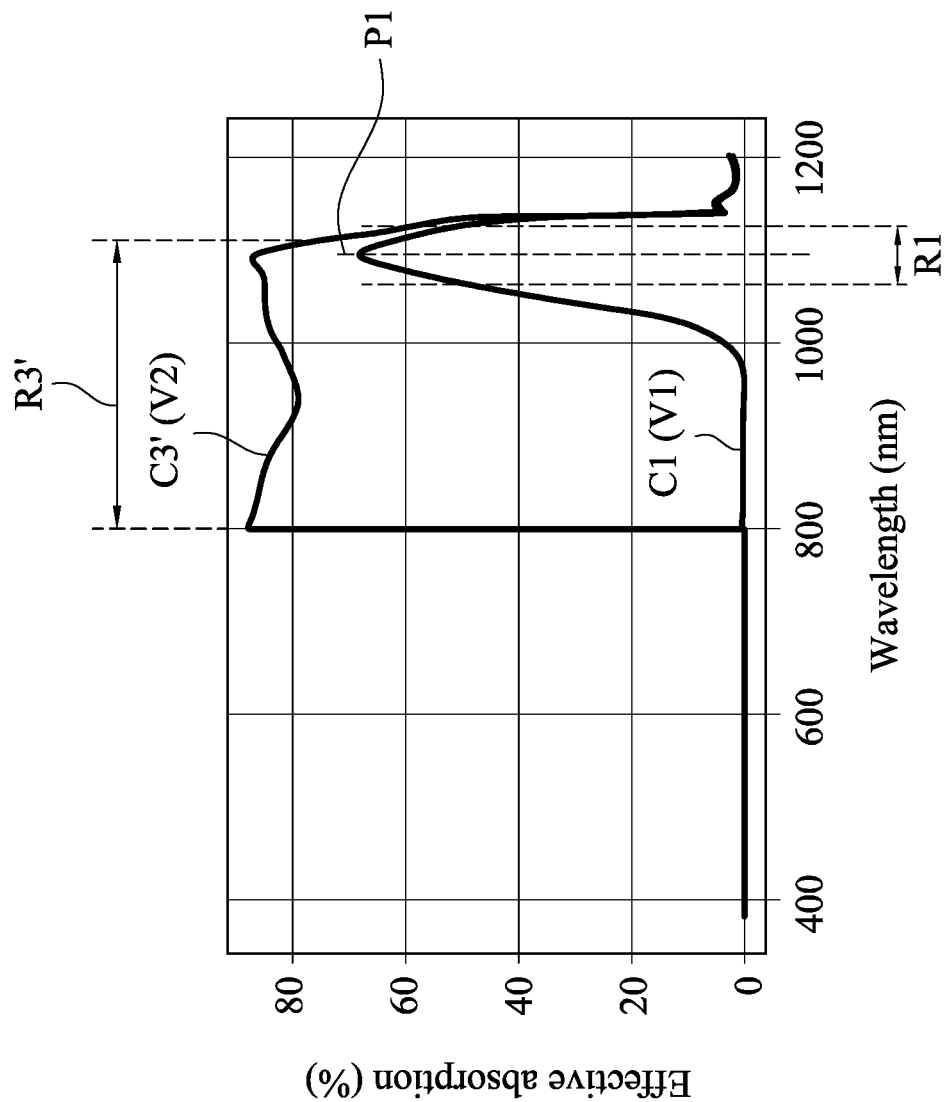
FIG. 7 is a schematic diagram of multiple optical characteristics of the optical sensor in FIG. 6 corresponding to the different voltage levels of the bias voltage in accordance with some embodiments of the present disclosure.

In some embodiments, the multilayer film filter layer 80 is configured to filter out the visible light with the wavelength range between 400-800 nm, which results in the optical sensor 30 of the image sensor 600 having optical characteristics different from those of the optical sensor 30 of the image sensor 100. Referring to FIG. 7, FIG. 7 is a schematic diagram of the optical characteristics of the optical sensor 30 of the image sensor 600 in accordance with some embodiments of the present disclosure. In FIG. 7, a curve C3' represents one optical characteristic of the optical sensor 30 of the image sensor 600 in the condition that the bias voltage Vbias has the second voltage level V2. The elements in FIG. 7 denoted by the same reference characters as those in FIG. 3 will not be repeatedly described herein.

In the condition that the bias voltage Vbias having the second voltage level V2 is applied to the image sensor 600, the optical sensor 30 of the image sensor 600 is controlled in an absorption spectrum range R3'. As shown in FIG. 7, the absorption spectrum range R3' is wider than the absorption spectrum range R1, but is narrower than the absorption spectrum range R2 (as shown in FIG. 3) because the visible light with the wavelength range between 400-800 nm is filtered out by the multilayer film filter layer 80. In the embodiments of FIG. 7, the absorption spectrum range R3' is substantially between 800-1100 nm, however, the present disclosure is not limited herein. For example, in some embodiments, the absorption spectrum range R3' is substantially between 800-940 nm, 800-1310 nm, 800-1350 nm, 800-1400 nm, 800-1450 nm or 800-1550 nm.

In addition, the image sensor 600 is operated in the wideband mode when the optical sensor 30 has the absorption spectrum range R3' according to the second voltage level V2. Referring to FIG. 6 again, in the wideband mode, the photoelectric conversion layer 31 of the optical sensor 30 is configured to absorb another third light L3' with another third wavelength range, and is configured to generates another third current signal Ib3' corresponding to the third light L3' to the pixel circuit 41. Then, the pixel circuit 41 generates the output voltage Vout according to the third current signal Ib3'. The third wavelength range of the third light L3' is substantially corresponding to (e.g., within or mostly overlapping) the absorption spectrum range R3' as shown in FIG. 7. As can be seen from above that, the third light L3' is visible light (having the wavelength longer than 800 nm), NIR light, SWIR light, or a combination thereof.

Figure 8:
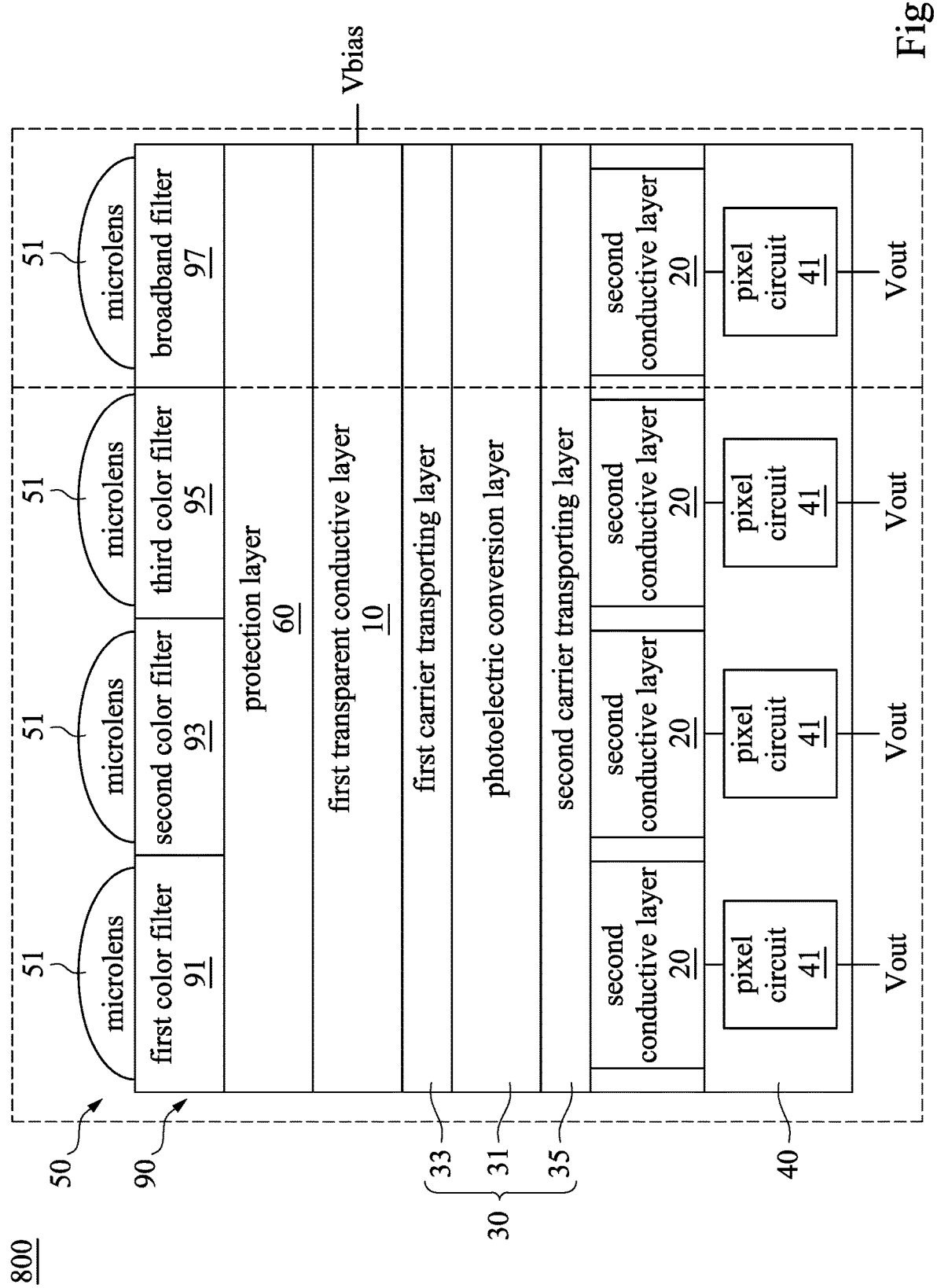
FIG. 8 is a sectional diagram of an image sensor in accordance with some embodiments of the present disclosure.

Referring to FIG. 8, FIG. 8 is a sectional diagram of an image sensor 800 in accordance with some embodiments of the present disclosure. The first transparent conductive layer 10, the optical sensor 30 and the protection layer 60 of the image sensor 800 are similar to the components denoted by the same reference characters of FIG. 1, and therefore the detailed descriptions thereof are omitted herein. The image sensor 800 includes a plurality of second conductive layers 20. The microlens layer 50 of the image sensor 800 comprises a plurality of microlens 51. The semiconductor substrate 40 of the image sensor 800 comprises a plurality of pixel circuits 41. The second conductive layers 20 are respectively connected to the pixel circuits 41. Each of the microlen 51, the pixel circuit 41 and the second conductive layer 20 has elements, operations and connection relationships similar to the components denoted by the same reference characters of FIG. 1, and therefore the detailed descriptions thereof are omitted herein. The image sensor 800 further includes a color filter array layer 90. As shown in FIG. 8, the color filter array layer 90 is arranged between the microlens layer 50 and the protection layer 60.

In some embodiments, as shown in FIG. 8, the color filter array layer 90 includes a first color filter 91, a second color filter 93, a third color filter 95, and a broadband filter 97. In particular, the first color filter 91 is configured to allow red light of the visible light to pass through, the second color filter 93 is configured to allow green light of the visible light to pass through, and the third color filter 95 is configured to allow blue light of the visible light to pass through. In addition, the broadband filter 97 is configured to allow any light (e.g., UV light, visible light, NIR light, SWIR light, etc.) to pass through.

Figure 9:
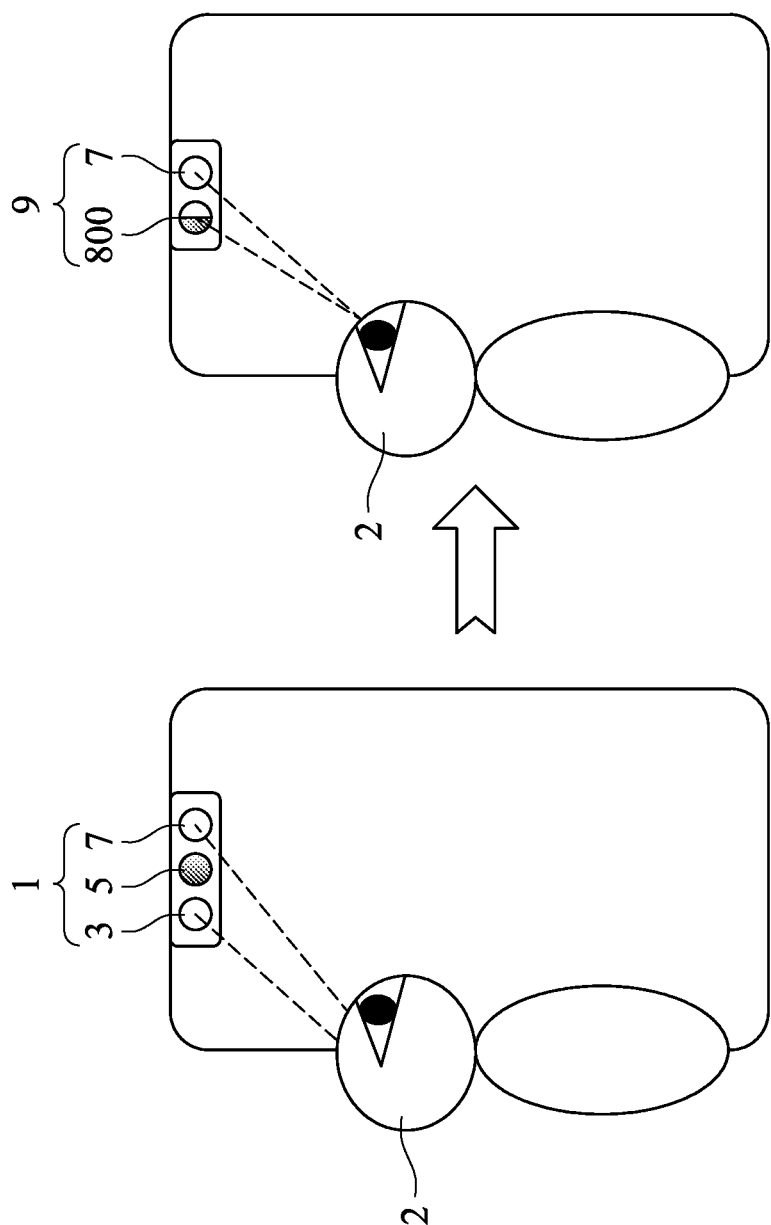
FIG. 9 is a schematic diagram of a camera device in accordance with some related arts and a camera device in accordance with some embodiments of the present disclosure.

Referring to FIG. 9, FIG. 9 is a schematic diagram of a camera device 1 in accordance with some related arts and a camera device 9 in accordance with some embodiments of the present disclosure. The camera device 1 includes an infrared (IR) sensor 3, a color sensor 5 and an IR emitter 7. The camera device 1 can use the color sensor 5 to sense ambient light and/or photograph, and can use both the IR sensor 3 and the IR emitter 7 to perform face recognition on a user 2. The camera device 9 includes the image sensor 800 (as shown in FIG. 8) and the IR emitter 7. In accordance with the embodiments of FIG. 8, by adjusting the voltage level of the bias voltage Vbias, the camera device 9 can operate the image sensor 800 in the broadband mode for sensing the ambient light and/or photographing, and can also operates the image sensor 800 in the narrowband mode for performing the face recognition on the user 2. As can be seen from above that, the image sensor 800 of the present disclosure can be used as a substitute for the IR sensor 3 and the color sensor 5, so that the camera device 9 has the advantages of low cost and small overall circuit area. In some embodiments, the camera device 9 may be implemented as a front camera of a smart phone to increase the screen to body ratio.

Figure 10:
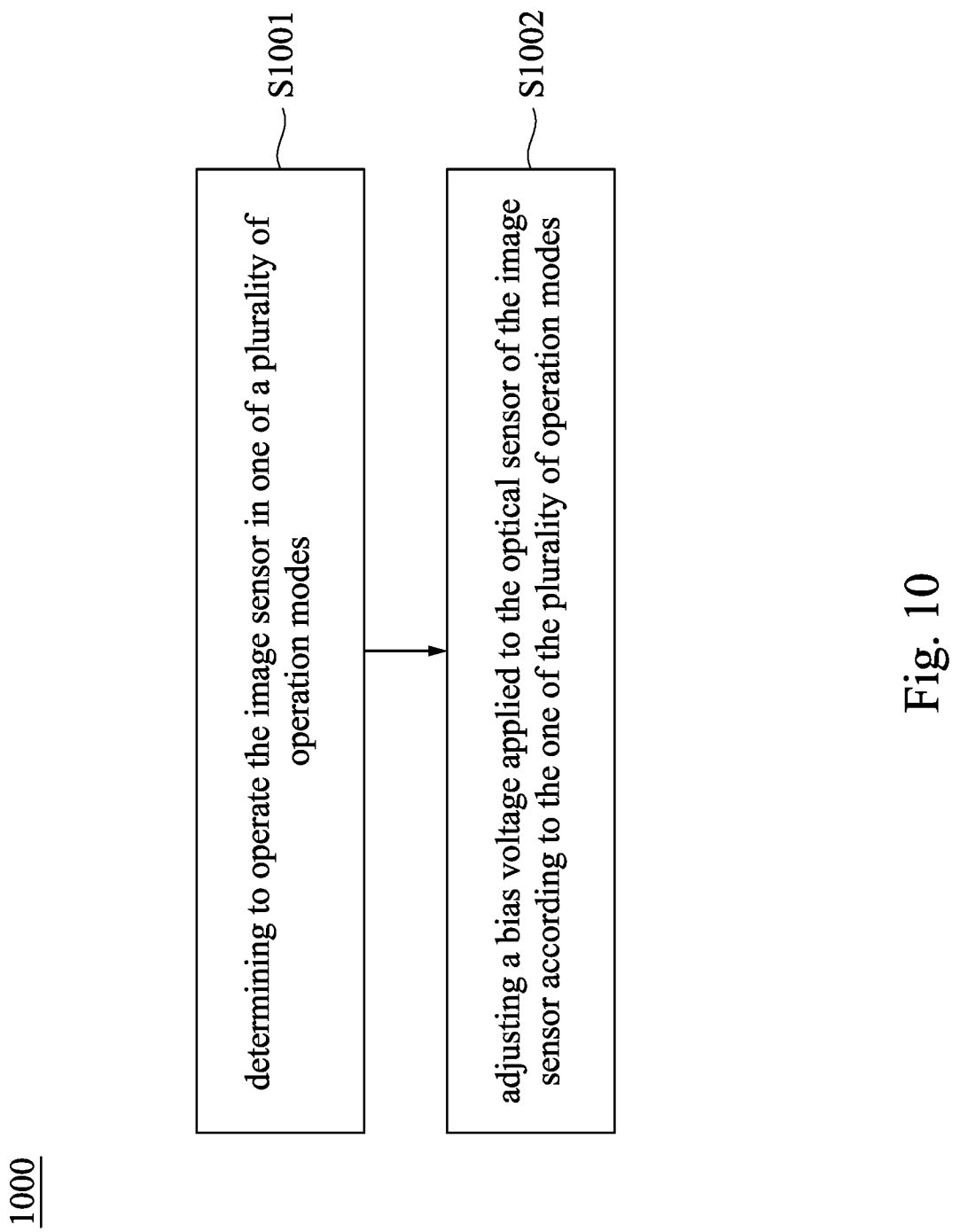
FIG. 10 is a flow diagram of a control method of image sensor in accordance with some embodiments of the present disclosure.

Referring to FIG. 10, FIG. 10 is a flow diagram of a control method 1000 in accordance with some embodiments of the present disclosure. In some embodiments, the control method 1000 is configured to control any of the image sensors 100, 400, 600 and 800 of the present disclosure. As shown in FIG. 10, the control method 1000 includes steps S1001-S1002, but the present disclosure is not limited herein. For the convenience of descriptions, steps S1001-S1002 would be described with the image sensor 100 of FIGS. 1-2.

In step S1001, the image sensor 100 is determined to be operated in one of multiple operation modes. In some embodiments, the operation mode of the image sensor 100 may be determined by the processing circuit 45 of the electronic imaging device according to an operation command. For example, the operation command indicates that a predetermined operation (e.g., photographing, face recognition, motion detection, machine vision, etc.) would be performed. The processing circuit 45 can choose the operation mode corresponding to the predetermined operation from the operation modes of the image sensor 100.

In step S1002, the bias voltage Vbias applied to the optical sensor 30 of the image sensor 100 is adjusted according to the operation mode determined in step S401. As set forth above, the operation modes of the image sensor 100 are corresponding to the different voltage levels of the bias voltage Vbias. In some embodiments, a lookup table having the relationship between the operation modes of the image sensor 100 and the voltage levels of the bias voltage Vbias is pre-stored in the electronic imaging device, and is accessible to the processing circuit 45. In such arrangement, the processing circuit 45 can find the voltage level corresponding to the operation mode determined in step S401 through the lookup table, and controls the multiplexer 43 by the control signal Vc to adjust the bias voltage Vbias to the voltage level being found, so that the image sensor 100 would be operated in the operation mode determined in step S401. In accordance with the embodiments of FIG. 2, the bias voltage Vbias is adjusted to the first voltage level V1 when the image sensor 100 is determined to be operated in the narrowband mode, and is adjusted to the second voltage level V2 when the image sensor 100 is determined to be operated in the broadband mode. The operation of the image sensor 100 in the narrowband mode and the broadband mode are similar to those of the above embodiments, therefore are not repeatedly described herein. The controls of other image sensors 400, 600 and 800 are similar to those of the image sensor 100, therefore are omitted herein.

Figure 11B:
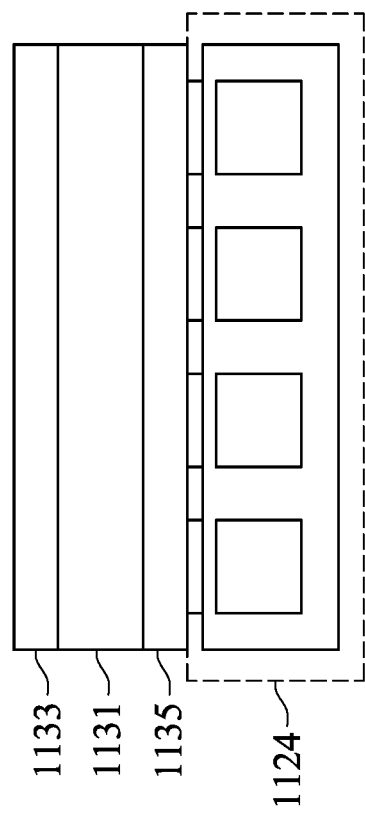
FIGS. 11A-11K are sectional diagrams illustrating the process of manufacturing the optical sensor and the first transparent conductive layer in accordance with some embodiments of the present disclosure.
Figure 11A:
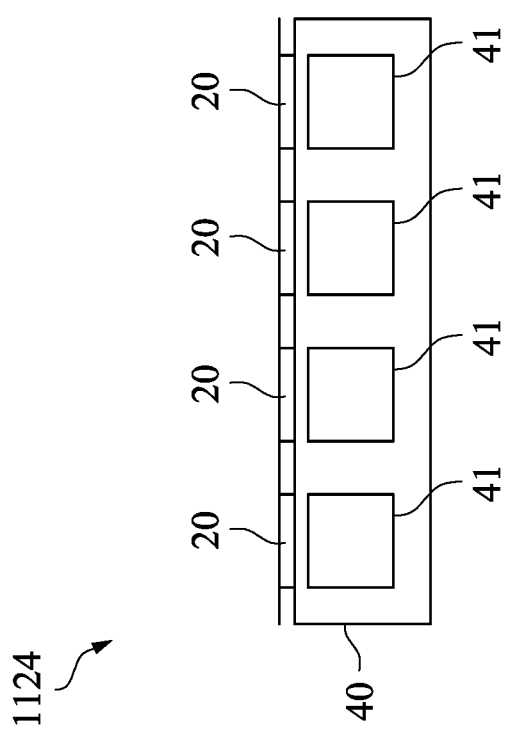

The process of manufacturing a portion of the image sensor of the present disclosure would be described herein with reference to FIGS. 11A-11K. Referring FIGS. 11A-11K, FIGS. 11A-11K are sectional diagrams illustrating the process of manufacturing the optical sensor 30 and the first transparent conductive layer 10 in accordance with some embodiments of the present disclosure. In some embodiments, as shown in FIG. 11A, a semiconductor layer 1124 is provided. The semiconductor layer 1124 can be implemented by the second conductive layer 20 and the semiconductor substrate 40 illustrated in FIG. 1. Therefore, the descriptions of the semiconductor layer 1124 are omitted herein.

In some embodiments, as shown in FIG. 11B, a second carrier transporting material 1135, a photoelectric conversion material 1131 and a first carrier transporting material 1133 are sequentially formed on the semiconductor layer 1124. In particular, the second carrier transporting material 1135, the photoelectric conversion material 1131 and the first carrier transporting material 1133 each is formed by blade coating, slot-die coating, spin coating or screen printing.

Figure 11D:
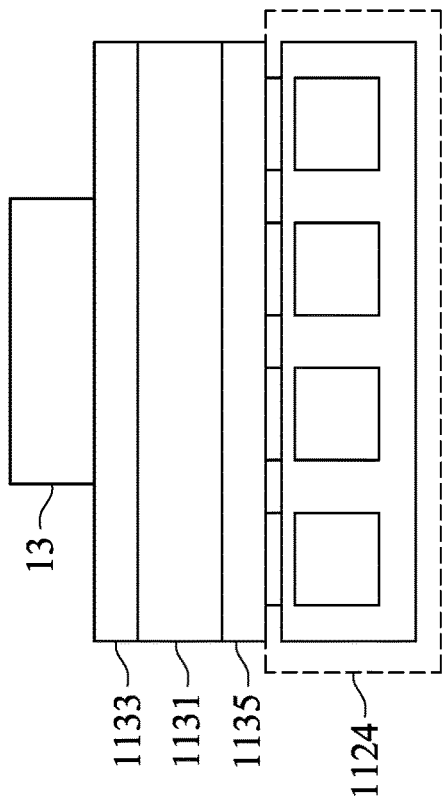
Figure 11C:
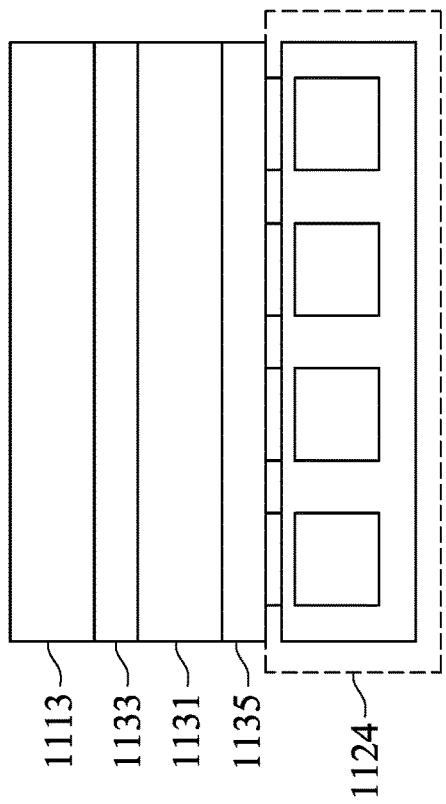

In some embodiments, as shown in FIG. 11C, a photoresist material 1113 is formed on the first carrier transporting material 1133 by spin coating. Then, as shown in FIG. 11D, the photoresist material 1113 is sequentially exposed and developed to form a photoresist layer 13 on the first carrier transporting material 1133.

Figure 11F:
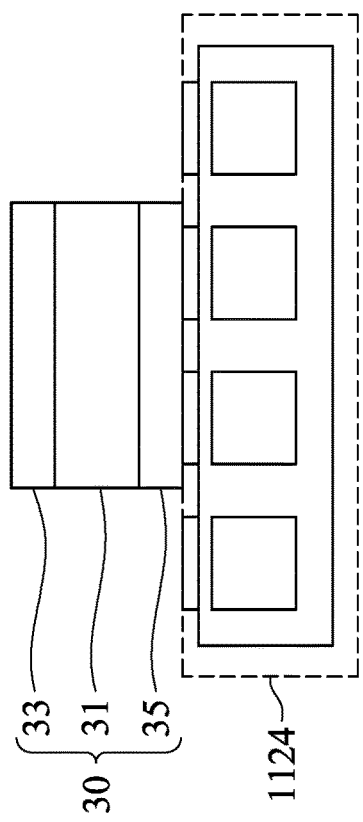
Figure 11E:
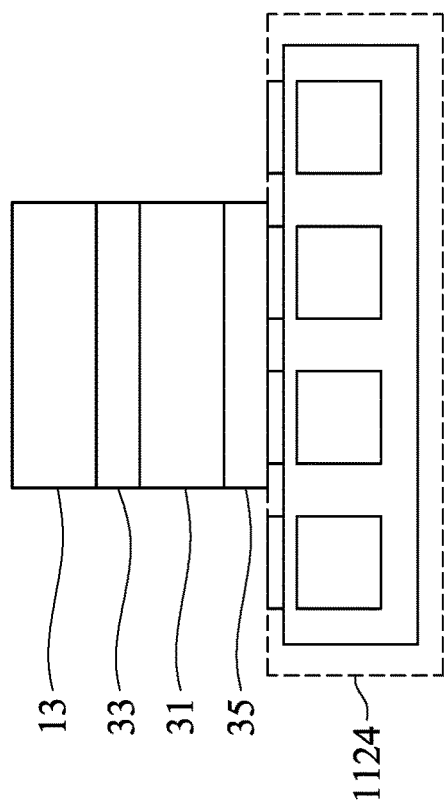

In accordance with the embodiments of FIG. 11D, dry etching is performed over the semiconductor layer 1124. While the dry etching is performed, the photoresist layer 13 formed on the first carrier transporting material 1133 is used as the etch mask. Accordingly, as shown in FIG. 11E, the second carrier transporting layer 35, the photoelectric conversion layer 31 and the first carrier transporting layer 33 are formed below the photoresist layer 13. Thereafter, as shown in FIG. 11F, the photoresist layer 13 is stripped off the first carrier transporting layer 33, so that the optical sensor 30 is formed on the semiconductor layer 1124.

Figure 11H:
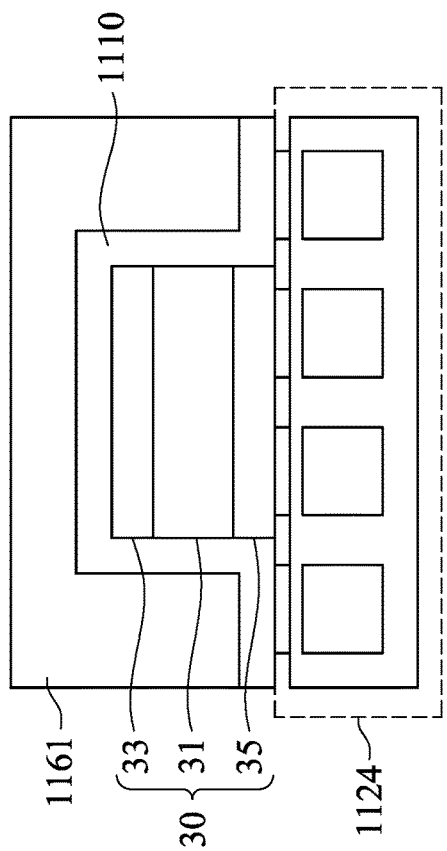
Figure 11G:
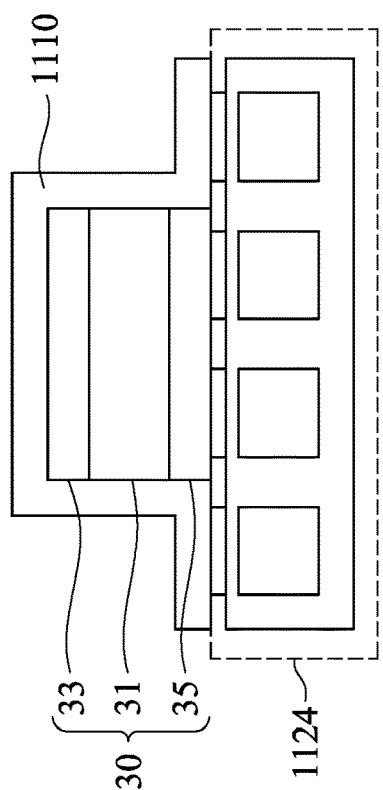

In some embodiments, as shown in FIG. 11G, a transparent conductive material 1110 is formed over the semiconductor layer 1124, so as to envelop the optical sensor 30 on the semiconductor layer 1124. As shown in FIG. 11H, a photoresist material 1161 is formed on the transparent conductive material 1110 by spin coating. Then, as shown in FIG. 11I, the photoresist material 1161 is sequentially exposed and developed to form a photoresist layer 61 on the transparent conductive material 1110.

Figure 11J:
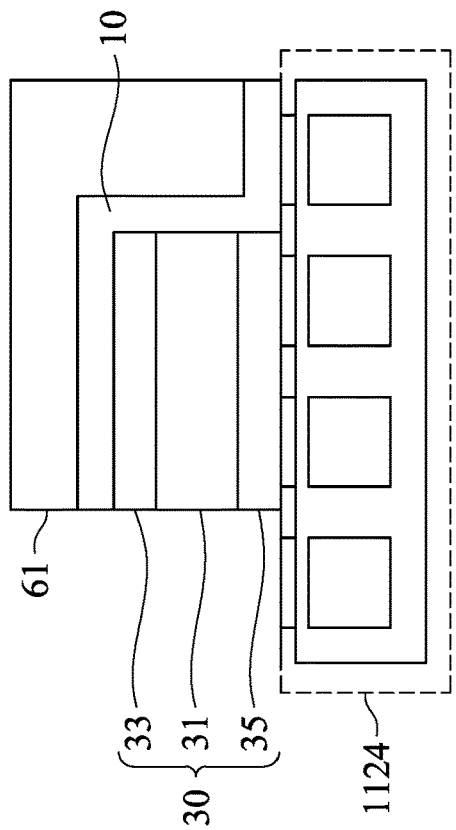
Figure 11I:
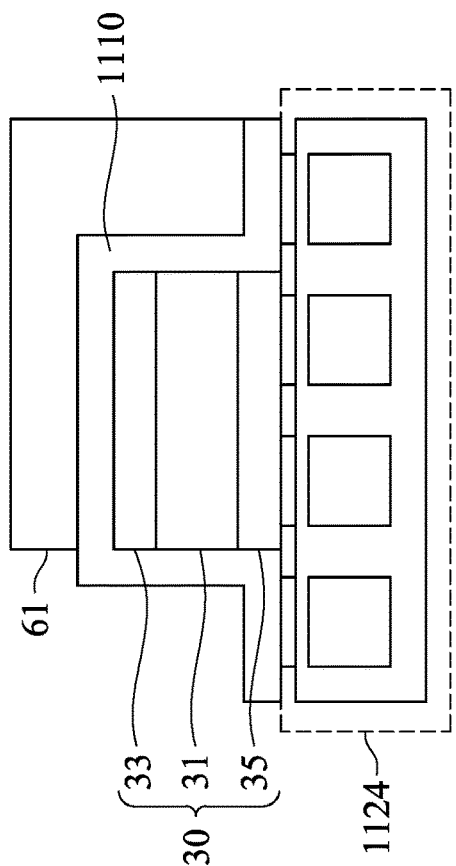
Figure 11K:
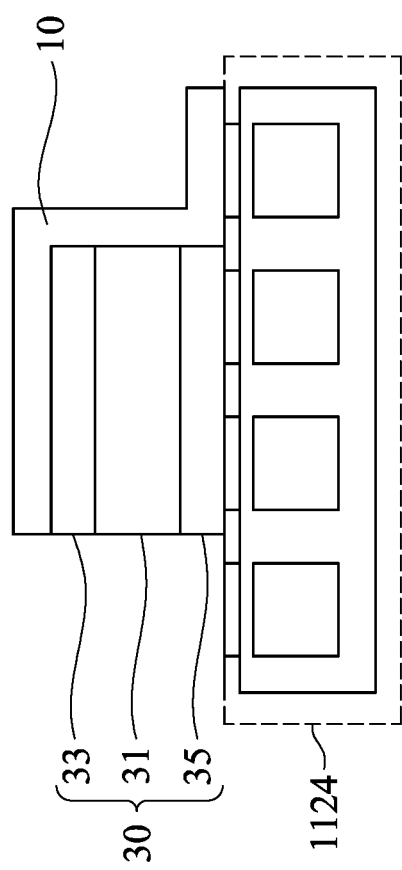

In accordance with the embodiments of FIG. 11I, the dry etching is performed over the semiconductor layer 1124 again. While the dry etching is performed, the photoresist layer 61 formed on the transparent conductive material 1110 is used as the etch mask. Accordingly, as shown in FIG. 11J, the first transparent conductive layer 10 is formed below the photoresist layer 61. Thereafter, as shown in FIG. 11K, the photoresist layer 61 is stripped off the first transparent conductive layer 10.

As can be seen from the above embodiments of the present disclosure, by applying the photoelectric conversion layer 31 with the thickness T1 ranging from 500 to 10000 nm, the image sensors 100, 400, 600 and 800 of the present disclosure can be switched among multiple operation modes by controlling the voltage level of the bias voltage Vbias, so as to adapt to different applications. Based on the above, the image sensors 100, 400, 600 and 800 of the present disclosure have advantages of low cost and low fabrication complexity.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. An image sensor, comprising:
    a first transparent conductive layer;
    a second conductive layer; and
    an optical sensor arranged between the first transparent conductive layer and the second conductive layer, and comprising a photoelectric conversion layer, wherein the photoelectric conversion layer has a thickness ranging from 500 to 10000 nm, and the optical sensor has a plurality of absorption spectrum ranges; and
    a semiconductor substrate below the second conductive layer.

2. The image sensor of claim 1, further comprising a polymer layer arranged below the first transparent conductive layer, wherein the polymer layer is configured to filter out a visible light with a wavelength range between 400-650 nm.

3. The image sensor of claim 1, further comprising a microlens layer over the first transparent conductive layer.

4. The image sensor of claim 3, further comprising a multilayer film filter layer over the microlens layer, wherein the multilayer film filter layer is configured to filter out a visible light with a wavelength range between 400-800 nm.

5. The image sensor of claim 4, wherein the multilayer film filter layer is arranged over the microlens layer via a low refractive index material.

6. The image sensor of claim 3, further comprising a protection layer arranged between the microlens layer and the first transparent conductive layer, wherein the protection layer comprises an oxide material, a nitride material, an oxynitride material or a combination thereof.

7. The image sensor of claim 6, further comprising a color filter array layer arranged between the microlens layer and the protection layer, wherein the color filter array layer comprises a red color filter, a green color filter, a blue color filter and a broadband filter.

8. The image sensor of claim 1, wherein the optical sensor further comprises a first carrier transporting layer, and the first carrier transporting layer is arranged between the first transparent conductive layer and the photoelectric conversion layer.

9. The image sensor of claim 8, wherein the optical sensor further comprises a second carrier transporting layer, and the second carrier transporting layer is arranged between the photoelectric conversion layer and the second conductive layer.

10. The image sensor of claim 1, wherein the semiconductor substrate comprises a pixel circuit electrically coupled to the second conductive layer, and the pixel circuit is configured to output an output signal according to a current signal generated by the optical sensor.

11. The image sensor of claim 1, wherein the optical sensor is configured to receive a bias voltage via the first transparent conductive layer, and the optical sensor is controlled in one of the plurality of absorption spectrum ranges according to a voltage level of the bias voltage.

12. The image sensor of claim 1, wherein the plurality of absorption spectrum ranges comprises a first absorption spectrum range;
wherein when the optical sensor is controlled in the first absorption spectrum range, the photoelectric conversion layer is configured to absorb a first light with a first wavelength range, and is configured to generate a first current signal corresponding to the first light;
wherein a peak wavelength of the first wavelength range is 940, 1100, 1310, 1350, 1400, 1450, or 1550 nm.

13. The image sensor of claim 12, wherein the plurality of absorption spectrum ranges comprises a second absorption spectrum range;
wherein when the optical sensor is controlled in the second absorption spectrum range, the photoelectric conversion layer is configured to absorb a second light with a second wavelength range, and is configured to generate a second current signal corresponding to the second light;
wherein the second wavelength range is between 400-940 nm, 400-1100 nm, 400-1310 nm, 400-1350 nm, 400-1400 nm, 400-1450 nm, or 400-1550 nm.

14. The image sensor of claim 12, wherein the plurality of absorption spectrum ranges comprises a third absorption spectrum range;
wherein when the optical sensor is controlled in the third absorption spectrum range, the photoelectric conversion layer is configured to absorb a third light with a third wavelength range and is configured to generate a third current signal corresponding to the third light;
wherein the third wavelength range is between 650-940 nm, 650-1100 nm, 650-1310 nm, 650-1350 nm, 650-1400 nm, 650-1450 nm, 650-1550 nm, 800-940 nm, 800-1100 nm, 800-1310 nm, 800-1350 nm, 800-1400 nm, 800-1450 nm, or 800-1550 nm.

15. A control method of image sensor, wherein the image sensor comprises an optical sensor, and the control method comprises:
determining to operate the image sensor in one of a plurality of operation modes;
adjusting a bias voltage applied to the optical sensor to a first voltage level when the image sensor is determined to operate in a narrowband mode of the plurality of operation modes, so that the optical sensor has a first absorption spectrum range; and
adjusting the bias voltage to a second voltage level different from the first voltage level when the image sensor is determined to operate in a broadband mode or a wideband mode of the plurality of operation modes, so that the optical sensor has a second absorption spectrum range or a third absorption spectrum range, wherein the second absorption spectrum range and the third absorption spectrum range both are wider than the first absorption spectrum range.

16. The control method of claim 15, wherein when the image sensor is operated in the narrowband mode, the optical sensor absorbs a first light according to the first absorption spectrum range, wherein the first light is a near-infrared (NIR) light, a shortwave infrared (SWIR) light, or a combination thereof.

17. The control method of claim 15, wherein when the image sensor is operated in the broadband mode, the optical sensor absorbs a second light according to the second absorption spectrum range, wherein the second light is an ultraviolet (UV) light, a visible light, a near-infrared (NIR) light, a shortwave infrared (SWIR) light, or a combination thereof.

18. The control method of claim 17, wherein the second absorption spectrum range is between 400-940 nm, 400-1100 nm, 400-1310 nm, 400-1350 nm, 400-1400 nm, 400-1450 nm, or 400-1550 nm.

19. The control method of claim 15, wherein when the image sensor is operated in the wideband mode, the optical sensor absorbs a third light according to the third absorption spectrum range, wherein the third light is a visible light, a near-infrared (NIR) light, a shortwave infrared (SWIR) light, or a combination thereof.

20. The control method of claim 18, wherein the third absorption spectrum range is between 650-940 nm, 650-1100 nm, 650-1310 nm, 650-1350 nm, 650-1400 nm, 650-1450 nm, 650-1550 nm, 800-940 nm, 800-1100 nm, 800-1310 nm, 800-1350 nm, 800-1400 nm, 800-1450 nm, or 800-1550 nm.

* * * * *